(12) United States Patent
Pack et al.

(10) Patent No.: US 7,784,016 B2
(45) Date of Patent: Aug. 24, 2010

(54) METHOD AND SYSTEM FOR CONTEXT-SPECIFIC MASK WRITING

(75) Inventors: Robert C. Pack, Foster City, CA (US); Louis K. Scheffer, Campbell, CA (US)

(73) Assignee: Cadence Design Systems, Inc., San Jose, CA (US)

( * ) Notice: Subject to any disclaimer, the term of this patent is extended or adjusted under 35 U.S.C. 154(b) by 501 days.

(21) Appl. No.: 11/781,801

(22) Filed: Jul. 23, 2007

(65) Prior Publication Data

US 2007/0266364 A1  Nov. 15, 2007

Related U.S. Application Data

(62) Division of application No. 10/620,285, filed on Jul. 14, 2003, now Pat. No. 7,249,342.

(60) Provisional application No. 60/395,415, filed on Jul. 12, 2002.

(51) Int. Cl.
*G06F 17/50* (2006.01)

(52) U.S. Cl. ............... 716/19; 716/1; 716/17

(58) Field of Classification Search ............ 716/1, 716/17, 19
See application file for complete search history.

(56) References Cited

U.S. PATENT DOCUMENTS

| | | |
|---|---|---|
| 4,247,203 A | 1/1981 | Levy et al. |
| 5,553,273 A | 9/1996 | Liebmann |
| 5,553,274 A | 9/1996 | Liebmann |
| 5,567,550 A | 10/1996 | Smayling |
| 5,580,687 A | 12/1996 | Leedy |
| 5,740,068 A | 4/1998 | Liebmann et al. |
| 5,821,014 A | 10/1998 | Chen et al. |
| 5,879,866 A | 3/1999 | Starikov et al. |
| 5,932,377 A | 8/1999 | Ferguson et al. |
| 5,965,306 A | 10/1999 | Mansfield et al. |
| 6,051,347 A | 4/2000 | Tzu et al. |
| 6,168,891 B1 | 1/2001 | Shibata |
| 6,282,696 B1 | 8/2001 | Garza et al. |
| 6,285,488 B1 | 9/2001 | Sandstrom |
| 6,421,820 B1 | 7/2002 | Mansfield et al. |
| 6,456,899 B1 | 9/2002 | Gleason et al. |
| 6,523,165 B2 | 2/2003 | Liu et al. |
| 6,526,550 B1 | 2/2003 | Badding et al. |

(Continued)

FOREIGN PATENT DOCUMENTS

EP  1031876 A2  8/2000

(Continued)

OTHER PUBLICATIONS

Balasinski, A. et al. "Comparison of Mask Writing Tools and Mask Simulations for 0.16 μm Devices" Proceedings of the IEEE/SEMI Advanced Semiconductor Manufacturing Conference and Workshop Boston, MA, Sep. 8-10, 1999, pp. 372-377.

(Continued)

*Primary Examiner*—Thuan Do
(74) *Attorney, Agent, or Firm*—Vista IP Law Group, LLP

(57) ABSTRACT

A method for generating lithography masks includes generating integrated circuit design data and using context information from the integrated circuit design data to write a mask.

21 Claims, 6 Drawing Sheets

U.S. PATENT DOCUMENTS

| | | |
|---|---|---|
| 6,529,621 B1 | 3/2003 | Glasser et al. |
| 6,535,774 B1 | 3/2003 | Bode et al. |
| 6,560,766 B2 | 5/2003 | Pierrat et al. |
| 6,571,383 B1 | 5/2003 | Butt et al. |
| 6,578,188 B1 * | 6/2003 | Pang et al. .................... 716/19 |
| 6,579,651 B2 | 6/2003 | Subramanian et al. |
| 6,625,801 B1 | 9/2003 | Pierrat et al. |
| 6,634,018 B2 | 10/2003 | Randall et al. |
| 6,654,488 B1 | 11/2003 | Behun et al. |
| 6,658,640 B2 | 12/2003 | Weed |
| 6,670,082 B2 | 12/2003 | Liu et al. |
| 6,703,167 B2 | 3/2004 | LaCour |
| 6,748,103 B2 | 6/2004 | Glasser et al. |
| 6,748,578 B2 | 6/2004 | Cobb |
| 6,787,271 B2 | 9/2004 | Côté et al. |
| 6,868,537 B1 | 3/2005 | Ho et al. |
| 6,901,574 B2 | 5/2005 | LaCour et al. |
| 7,024,638 B2 | 4/2006 | Scheffer et al. |
| 7,107,571 B2 | 9/2006 | Chang et al. |
| 7,231,628 B2 | 6/2007 | Pack et al. |
| 7,249,342 B2 | 7/2007 | Pack et al. |
| 7,302,672 B2 | 11/2007 | Pack et al. |
| 2002/0026626 A1 | 2/2002 | Randall et al. |
| 2002/0102476 A1 | 8/2002 | Hayano et al. |
| 2002/0155357 A1 | 10/2002 | LaCour |
| 2002/0157068 A1 | 10/2002 | LaCour et al. |
| 2002/0160281 A1 | 10/2002 | Subramanian et al. |
| 2003/0018948 A1 | 1/2003 | Chang et al. |
| 2003/0023939 A1 | 1/2003 | Pierrat et al. |
| 2003/0121021 A1 | 6/2003 | Liu et al. |
| 2003/0126581 A1 | 7/2003 | Pang et al. |
| 2003/0160980 A1 | 8/2003 | Olsson et al. |
| 2003/0165749 A1 | 9/2003 | Fritze et al. |
| 2003/0200523 A1 | 10/2003 | Takahashi et al. |
| 2004/0013952 A1 | 1/2004 | Elian et al. |
| 2004/0044984 A1 | 3/2004 | Keogan et al. |
| 2004/0067423 A1 | 4/2004 | Chen et al. |
| 2004/0107412 A1 | 6/2004 | Pack et al. |
| 2004/0133369 A1 | 7/2004 | Pack et al. |
| 2004/0172610 A1 | 9/2004 | Liebmann et al. |
| 2007/0233419 A1 | 10/2007 | Pack et al. |
| 2007/0266364 A1 | 11/2007 | Pack et al. |

FOREIGN PATENT DOCUMENTS

| | | | |
|---|---|---|---|
| EP | 1031876 A3 | 6/2004 | |
| JP | 63081570 A | 4/1988 | |
| JP | 2003100582 A | 4/2003 | |
| WO | 00/36525 A2 | 6/2000 | |
| WO | 03/023488 A1 | 3/2003 | |

OTHER PUBLICATIONS

Goering, R. "SEMI's Oasis provides respite from GDSII" EE Times Oct. 1, 2002, 3 pgs.

Grenon, B.J. et al. "A New Mask Lithography Tool for Advanced Mask Manufacturing" Microelectronic Engineering, Feb. 1995, vol. 27, No. 1, pp. 225-230, Elsevier Publishers BV, Amsterdam, NL.

Liebmann, L.W. et al., "TCAD Development for Lithography Resolution Enhancement", IBM Journal of Research and Development, Sep. 2001, vol. 45, No. 5, pp. 651-665.

Matsuyama, T. et al. "The novel inspection system with design rule check for high accuracy reticules" Part of the SPIE Symposium on Photomask and X-Ray Mask Technology VI, Proceedings of the SPIE, 1999, vol. 3748, pp. 563-571.

McCall, J. et al. "Integrated method of mask data checking and inspection data prep for manufacturable mask inspection: inspection rule violations" 21st Annual BACUS Symposium on Photomask Technology, Proceedings of the SPIE, Oct. 3, 2001, vol. 4562, No. 3, pp. 161-170.

Pack, R.C. et al. "GDS-3 Initiative: Advanced Design-through-Chip Infrastructure for Sub-Wavelength Technology", Proc. of Society of Photo-Optical Instrumentation Engineers (SPIE), 2002, vol. 4692, pp. 566-584.

Rieger, M.L. et al. "OPC Strategies to Minimize Mask Cost and Writing Time" 21st Annual BACUS Symposium on Photomask Technology, Proceedings of the SPIE, 2002, vol. 4562, pp. 154-160.

Wong, Alfred K., "Resolution Enhancement Techniques in Optical Lithography" 2001, Title page, copyright page, Chapter 1, SPIE Press, Bellingham, Washington.

International Search Report for PCT/US03/21996 dated May 4, 2004.

English Abstract for JP63081570.

English Abstract for JP2003100582.

Non-Final Office Action dated Nov. 24, 2009 for U.S. Appl. No. 11/760,715.

Non-Final office Action dated Nov. 19, 2008 for U.S. Appl. No. 11/760,715.

Final Office Action dated Jun. 11, 2009 for U.S. Appl. No. 11/760,715.

Final Office Action dated May 27, 2010 for U.S. Appl. No. 11/760,715.

* cited by examiner

METHOD AND SYSTEM FOR CONTEXT-SPECIFIC MASK WRITING

CROSS REFERENCE TO RELATED APPLICATIONS

This application is a divisional of U.S. application Ser. No. 10/620,285, filed on Jul. 14, 2003, which claims the benefit of U.S. Provisional Application No. 60/395,415, filed on Jul. 12, 2002, all of which are incorporated herein by reference in their entirety.

FIELD OF THE INVENTION

The present invention relates to photomasks for photolithographic production of integrated chips.

BACKGROUND OF THE INVENTION

Photolithography is a fabrication process by which patterns for various devices, such as integrated circuits (ICs), are generated on substrate wafers. This process generally starts with the design of an IC chip, including the various circuit elements, their electrical interconnects, and their physical layout across the chip. The IC design typically describes each layer required to fabricate the IC in a FAB using a photolithographic process. There are generally many layers to an IC chip.

After an integrated circuit is designed, a photomask is created. A photomask, or more simply a "mask," provides the master image of one layer of a given integrated chip's physical geometries. Masks are critical to the lithography process. There are different types of masks, including binary chrome-on-glass, attenuated phase-shifting masks (attPSM) and alternating phase-shifting masks (altPSM). Before being used in a photolithography system to replicate the mask image in reduced size onto a wafer when building the IC, the mask is inspected for defects. Defects found in the mask will often be repaired so that they will not be replicated on or introduce harmful distortions to the chips created from that mask.

A typical photolithography system projects UV light energy on to and through the mask in order to transmit the mask pattern in reduced size to the wafer surface, where it interacts with a photosensitive coating on the wafer. The photomask is a critical piece of the photolithography process, because it holds the essential integrated circuit design pattern information for circuits replicated from that mask. Masks may be created by various processes. In one method, an electron beam or a laser-based system is used in a photolithographic process to write the pattern on the mask in accordance with mask data developed to produce via lithography the intended chip pattern on the wafer.

The resolution limit of conventional optical lithography technology is increasingly being challenged by the sub wavelength, or low-kl, dimensions of the critical IC feature geometries. Not only are the critical dimension feature geometries decreasing in size in accordance with, or even faster than, Moore's Law predictions, the already large number of these feature geometries is growing at a dramatic rate as well. Furthermore, due to the necessity to mitigate optical proximity effect distortions through resolution enhancement techniques at the mask level, the overall polygonal figure count is skyrocketing. These critical feature geometries are patterned far more precisely as well due to the severity and sensitivity of the non-linear imaging. (These effects are often referred to in this context as resulting from the mask error enhancement factor, or MEEF). Extreme precision is required for sub wavelength, or low-kl, applications due to highly non-linear imaging behaviors which often magnify mask errors by large factors and non-intuitive manners.

With the overall year-to-year increase in IC logic function, industry trends towards larger and more complex system-on-chip and mixed signal designs, and increasingly aggressive use of artificial layout enhancement for manufacturability (LEM) features such as Resolution Enhancement Technology (RET) and dummy fill patterns, IC physical design layout data volume and resulting mask data file volume sizes are exploding. The overall design and manufacturing process integration complexity is also expanding, as it attempts to span a widening and deepening gap between the different technical disciplines and 'cultures' of manufacturing and design. This has led to increases in the length of time to create masks, in the number of errors impacting mask elements, and in the costs associated with the mask process.

Some of these difficulties may be described by example with respect to a traditional photolithography process, including mask creation and inspection methods, as shown in FIG. 1. At block 102 an integrated chip (IC) design is created, often by using various EDA systems such as those produced by Cadence Design Systems, Inc., of San Jose, Calif. An IC design flow typically starts with a desired circuit operation, then proceeds to a design layout for a set of circuit elements expected to produce that desired operation.

The IC design 102 may include circuit design and analysis, layout synthesis and routing, and verification and tapeout. The design 102 often produces a set of circuit elements in a layout to effect a desired circuit electrical operation on a layer-by-layer basis. This is often referred to as the design flow. For background on IC design and mask manufacturing processes, see *Resolution Enhancement Techniques in Optical Lithography*, Chapter 1, by Alfred K. Wong, SPIE Press, 2001, which is incorporated by reference in its entirety.

Up until tapeout, a vast amount of information is available, including, for example, the relation of the physical layout to the design schematic or netlist; individual circuit element models and properties; circuit criticalities; and manufacturing assumptions which were used in the IC design. Furthermore, the information is typically in a design hierarchy of fundamental library base cells, or 'hard IP,' of predesigned and characterized blocks, or 'cores.' Circuit elements at this level may include, for example, transistors, power buses, resistors, capacitors, and interconnects. Logos and manufacturing elements, such as area fill cells, may also be included.

Tapeout is typically the last step in the IC design flow and is the 'handoff' mechanism to manufacturing. Typically, tapeout produces a geometries-only design hierarchical data file in GDS-II stream format. However, a wealth of design knowledge is stripped out into this geometry-only format, and therefore is unavailable to any data file derived from it or any design or manufacturing integration process occurring thereafter.

Due to fundamental inherent limitations in current and near-future optical lithography processes, the layout of the IC is no longer directly equivalent to the pattern printed on the eventual IC wafer. As a result, various Resolution Enhancement Techniques (RETs) are used to compensate for various distortions, or to enable higher resolution, through advanced optical techniques. For background on RETs, see *Resolution Enhancement Techniques in Optical Lithography*, Chapter 1, by Alfred K. Wong, SPIE Press, 2001; and *TCAD Development for Lithography Resolution Enhancement*, L. W. Liebmann et al., IBM Journal of Research and Development, Vol. 45, No. 5, September 2001, both of which are incorporated herein by reference in their entirety. RETs are typically added at the bottom of the design flow, prior to tapeout, and out of view of the designer. However, increasingly more and more RET impact is being dealt with upstream in the design flow, with layout consideration and even RET insertion being applied earlier.

After the integrated circuit design is created, 102, a process to prepare mask data and create a job deck, 104, follows. This starts the mask flow, which runs through mask inspection and repair. Knowledge of the mask writing process, and to some extent the photolithography process, may be employed in 'fracturing' the GDS-II design database into a data file during mask data preparation. At 'fracturing,' the mask data is prepared for the mask writing equipment by breaking complex polygonal shapes into a simple base set of shapes and by applying mask writer electron- or laser-spot proximity effect shape, exposure compensation, and sizing operations to the data. Numerous output files may be generated.

Typically, the mask data is prepared into a MEBES data file format, although other formats may also be used. The MEBES file holds polygon and geometry information to be used in writing, but, like the GDS-II stream file, it holds none of the higher-level IC design or circuit feature functionality or criticality information available in the IC design flow. The MEBES file may include information detailing polygonal shapes, dimensions, positions on the mask, manufacturing features added to improve lithographic fidelity at the chip surface, and other parameters.

However, there is no 'knowledge' of what a feature is beyond its geometry and location. Conventionally, very little "design" is done at block 104, as the IC design process sets the layout and often most of the RET. This typically leaves only fracturing, job deck creation, and secondary chip surface feature additions (such as registration marks) to be handled during the preparation 104, after the IC design process 102 and before the mask writing process 106.

A mask writing process 106 then follows. Mask writing often involves writing the polygonal shapes and layout of a mask design pattern (from the MEBES file, for example) in a photo- or electron-sensitive coating (often called a "resist") on a mask substrate (often glass) and then etching in chrome, glass or other materials associated with the specific mask technology being employed (for example attPSM, altPSM). Mask writing may be based on various technologies, including electron beam-based or laser-based systems. The fidelity of a mask element written on a mask substrate may be defined by the energy applied, shaped-beam aperture employed, and possibly by the adjacency of other features due to laser, electron or thermo-chemical proximity effects on the mask. Positive effects of increased time and beam energy on element writing may be offset by negative impacts resulting from thermal and chemical changes in the surrounding photoresist caused by the applied energy. There is a tradeoff between optimizing writing speed and the deleterious effects of thermal, chemical and proximity effects related to the writing speed.

A mask writing system may be provided with and controlled by a database containing the mask's polygonal shape and layout information, such as the mask information in the MEBES data file. The design data connectivity and 'design intent' information usually have been destroyed by this point. Design data connectivity includes data relating to the electrical net list or schematic, functional intent and criticality of the various IC elements. Thus, the writing tool only receives simple polygonal shapes and location data. There is no knowledge of the design intention of a given polygon, nor a mechanism for establishing the requisite relationship in order to perform design-aware information processing.

In such systems, from this point on, imaging operations of mask writing and inspection operate under the most general uniform imaging assumptions of isotropic imaging. Therefore, the features are processed under the same conditions as their neighbors, and they are spatially invariant and device- and circuit-unaware. Thus, the polygonal shapes across the mask are treated equally in terms of their importance to the effectiveness of the resulting circuit. As the IC industry moves to deep sub-wavelength, or 'low k1, layout features, lens aberrations may increasingly violate these space-invariance assumptions, requiring additional higher-level consideration in the design flow as well as the mask flow.

In continuing reference to the example of a traditional photolithography process as shown in FIG. 1, after mask writing, a mask inspection process 108 is performed. A mask that has been written or printed with polygonal mask elements is inspected for defects. Such inspection often includes comparing a written mask against a perfect version of the mask as defined by its mask design database. Defects may include any departures from the mask design, such as missing, misaligned or misshapen shapes, pinholes, bridging features, or holes.

Defects in a mask are generally assumed to result in defects in an integrated circuit replicated from that mask. The mask inspection process 108 references only the polygonal shape and layout information from a mask data file 104 generated by the fracturing tool, which is often in a file format such as, for example, Klaris (an abbreviation for KLA-Tencor Reticle Inspection System, produced by KLA-Tencor, Inc. of San Jose, Calif.). Little information from the IC design process relating to the function or relative importance or criticality of individual mask elements can then be applied in comparing a mask to its mask design template. This is an isotropic approach to mask inspection. As a result, each mask element is inspected equally in terms of the time and resolution of the inspection system, regardless of its relative importance to the operation of the resulting circuit.

Typically, deviations from the ideal are considered defects. Some mask defects, however, have no significant negative impact on a circuit produced from the mask, and thus can be ignored as essentially "non-defects." The "non-defects" may include defects next to mask elements that do not require exact fidelity to effect their function, such as a logo or an area fill cell. Additionally, some defects may have a positive impact, and thus may be ignored or maintained on the mask. The "positive defects" may include a defect located at a distance (such as the Rayleigh distance, for example) from a mask element. This type of defect operates to enhance the depth of focus of the lithography for the mask element, which occurs with RET scattering bars, for example. The 'non-defects' and 'positive' defects may be waived or determined not to be defects for purposes of defect analysis or correction.

An analysis 110 is performed to discern whether any defects were found during the mask inspection process. Defects may be found near or on the polygonal mask shapes, such as in their relative positioning or in unintended shapes on the mask, such as pinholes, bridging, isolated artifacts or "hard" or "soft" defects. Defects may also include opaque or transparent errors on a mask. Transparent defects may not be visible under certain inspection conditions, or in the alternative may be visible in the inspection condition but not in the use condition. Such transparent defects may impact the phase of light passing through them resulting in unwanted optical interference effects, while opaque defects block or alter such light in some way. If no defects are found, then generally chip creation 118 is performed.

Each found defect is examined, 112, to determine if it can be repaired. If the defect is unrepairable, an analysis is performed to determine whether it may be accepted without repair. This decision may require advanced modeling and simulation of the defect under the specific lithography process being employed. An "unrepairable defect" might be a defect that cannot be easily fixed by a repair process, such as focused ion-milling or a deposition repair technique, for example.

An unrepairable defect requires the mask to be discarded and a new mask writing process, 116, to be performed. For example, a mask repair performed by ion beam milling or other processing may be more time-consuming and expensive than writing a new mask. Additionally, mask correction often creates further defects in a mask, as it may add unwanted material during the ion milling process or alternatively may erode the mask elements in some unwanted manner. Merely handling the mask may alter or damage it through any number of means, including electrostatic discharge (ESD).

At repair block 114, a mask repair process fixes the defect. Mask defect repair often involves focused ion beam (FIB) repair. After the mask correction is performed, the mask inspection process 108 is performed again to find any new defects which may have been introduced during the repair process. Such a cycle is often costly and time-consuming. Once a written mask is found to have either no defects or an acceptable number and type of defects during analysis 110, the integrated chip is created, 118.

During the photolithography process 118, the mask is used to transfer the mask pattern to a wafer. The mask allows light to pass through transparent sections defined by the polygonal mask elements previously written or etched thereon. An image of the mask so produced is then passed through an imaging lens system, often at a reduced image size, and replicated on a wafer surface through the lithography process to create the integrated circuit. Thus, the mask plays a critical role in transmitting the circuit design to the wafer surface.

Therefore, there is a need to allow image understanding in the context of circuit performance and manufacturing requirements, by providing important design awareness.

SUMMARY OF THE INVENTION

A method for generating lithography masks includes generating integrated circuit design data and using context information from the integrated circuit design data to write a mask.

As will be made apparent to those skilled in the art, other and further aspects and advantages of the present invention will appear hereafter.

BRIEF DESCRIPTION OF THE FIGURES

Embodiments of the present invention will be described with reference to the following figures.

DETAILED DESCRIPTION

A method and system are provided for improving mask writing processes. In an embodiment, the information developed in designing an integrated circuit, and the photomask to create it, are used to give context to the various polygonal shapes being written on a mask. The polygonal shapes of various circuit elements can then be written to a mask in a desired spatial design, using the contextual information, such as priority or ordering information, for example. The contextual information may be added or emphasized for use in guiding a mask writing process. The contextual information may include manufacturing and circuit context parameters, as well as information used by processes that prioritize and order various features.

Contextual information related to manufacturing may include, for example: specified resolution; criticality; additional proximity-effect distortions which may not have been accounted for or previously associated with a given mask feature; topological properties of a circuit layer resulting from mask features; associated chemical or thermal limitations; or any specified weight factors, criticality or region-based prioritization which may be beneficial for production quality and efficiencies. Contextual information related to the circuit may include, for example: associations with and feature properties of an element in the circuit (e.g. MOSFET or interconnect elements); priority criteria for the element relative to other such elements; or critical tolerances. Each mask element may then be created in the context of its individual parameters, rank, or order. Therefore, each mask element may receive an amount of mask writing system time, energy, order and resolution (such as with a shaped-beam writing system) that is commensurate with its mask-specific context.

In one embodiment, a process is provided whereby chip and mask design information to be used throughout a mask writing process is enhanced or re-ordered. This information may include context and priority information for each element of a mask, and be used to efficiently allocate the resources of a mask writing system. For example, each mask element could be written by the system with an amount of energy, time, and cost commensurate with its context, priority, or ranking relative to other mask elements.

A context specific mask writing process may be used in multipass writing, maskless circuit writing, and other controlled-beam writing processes. Context specific mask writing may also be applied to various IC technologies and materials, including silicon, silicon-on-insulator, silicon-germanium and gallium arsenide, as well as to integrated optical and mechanical "circuit" technologies, such as Integrated Optical Circuits, MEMS and micro-electro-optic-mechanical technologies.

Figure 1:
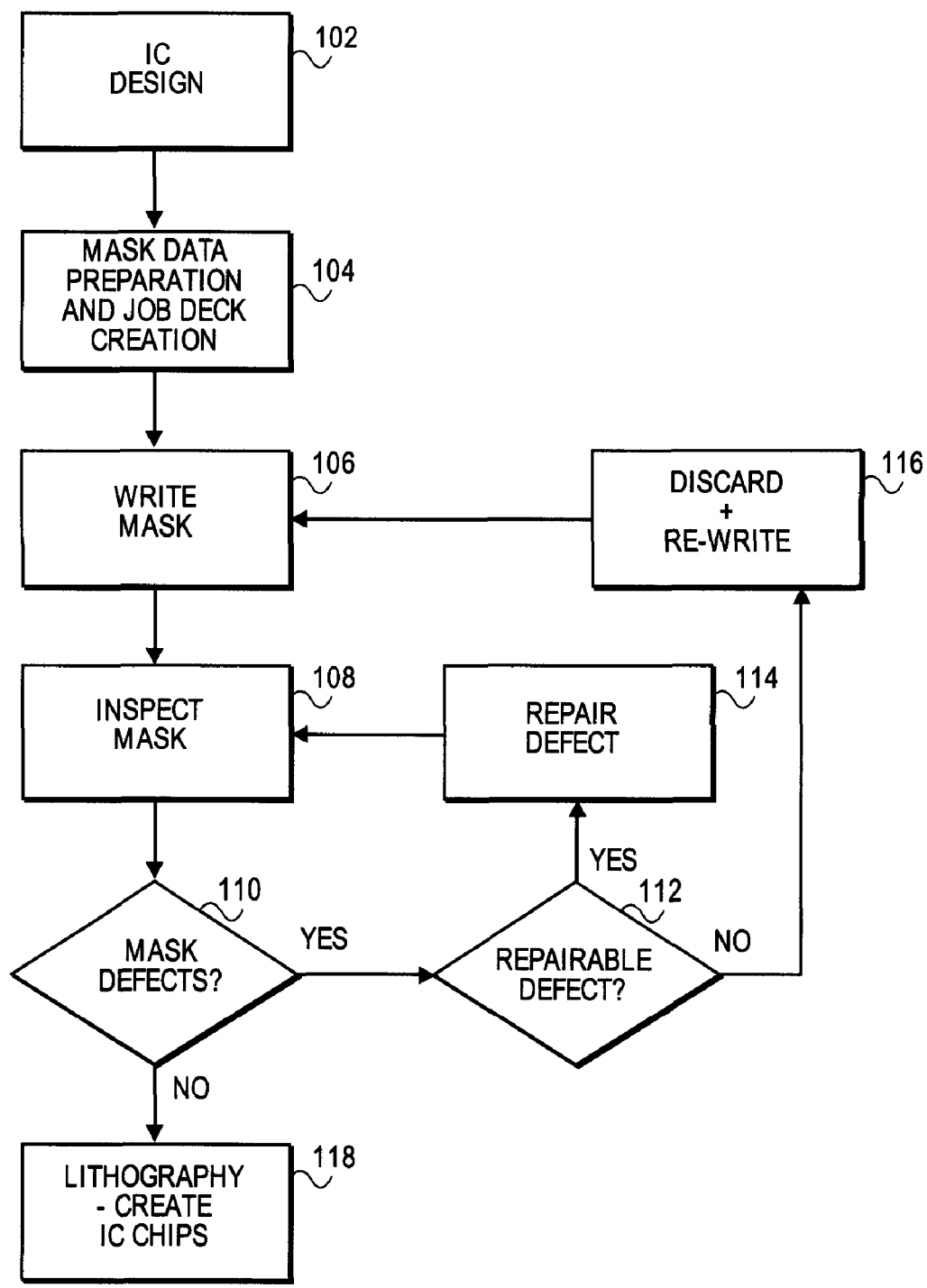
FIG. 1 is a flowchart view of an integrated chip design and manufacturing process.
Figure 2:
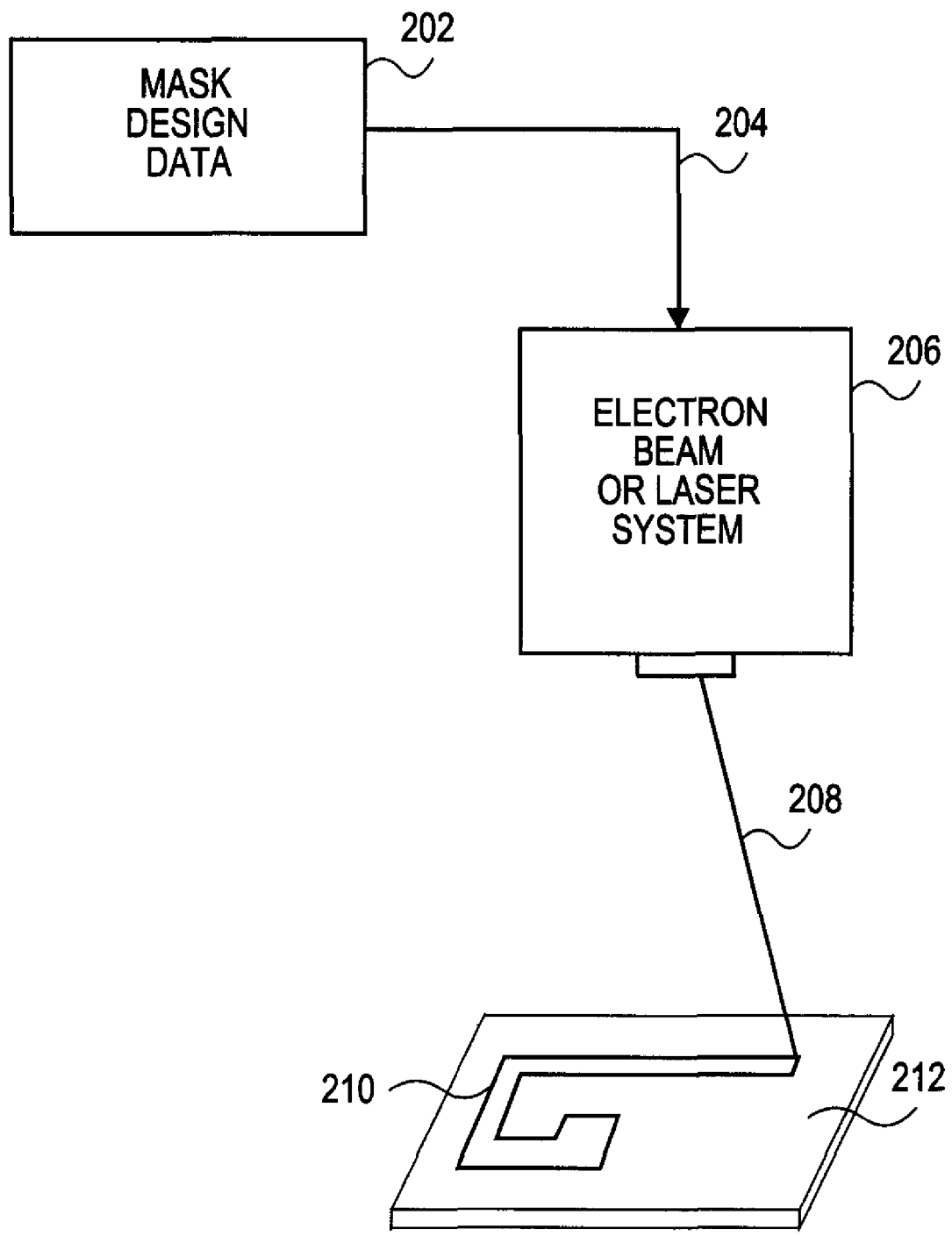
FIG. 2 is a schematic view of a mask writing system according to an embodiment of context-specific mask writing.

FIG. 2 represents a mask writing system according to an embodiment of context-specific mask writing. The system may include electron beam, laser, or dry chemical etch processes. Mask design information 202 may be provided to a mask writing system 206, via software or other data transfer methods 204, such as file transfer protocol (ftp) over an internet connection for example. Mask design data 202 is maintained on a computer readable medium, such as a hard disk or other computer storage media. The mask design data 202 may be used to define, for example, the cross-sectional shape of the writing beam; or the order, energy level or speed of traverse of the electron or laser beam 208, in order to produce polygonal elements in a desired layout on a mask surface 212.

Figure 3:
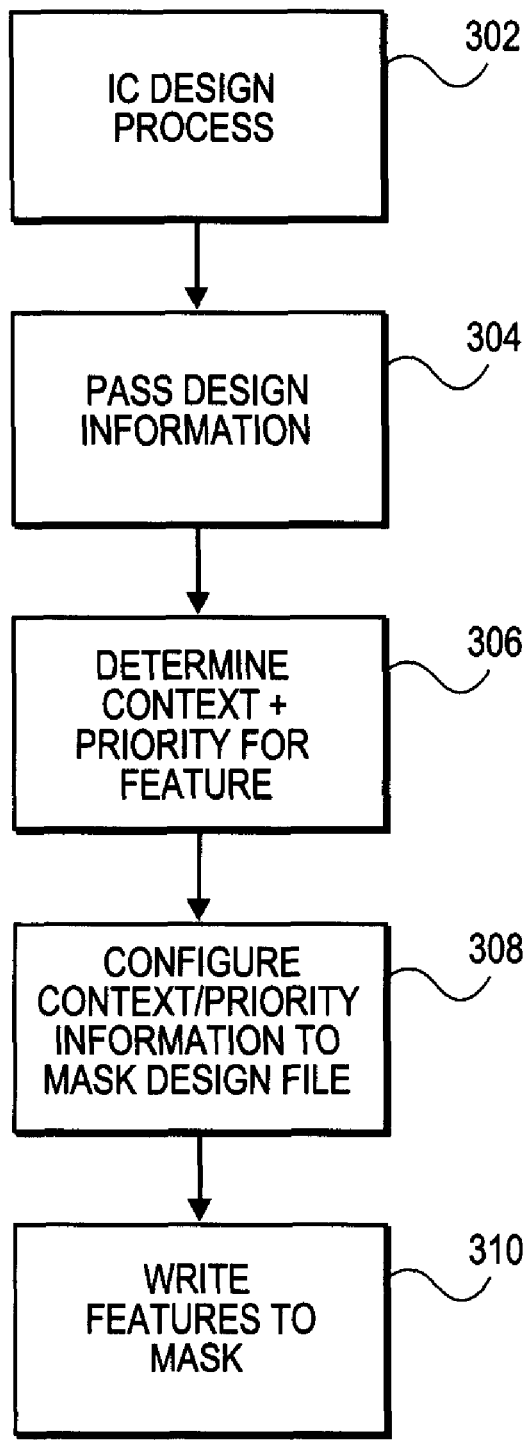
FIG. 3 is a flowchart view of an embodiment of a context-specific mask writing process for mask writing.

As an illustrative example, the sample shape 210 may be defined in a mask design database by various parameters, including dimensions, shape, orientation, location on the mask, priority, and criticality. The mask design data in an embodiment of context specific mask writing includes contextual information such as, for example, mask priority, circuit function and criticality, in addition to the polygonal shapes and location information found in conventional mask writing files, such as MEBES files. This contextual information and the design feed-forward it allows are described in greater detail as shown in FIG. 3. The design information may be provided to mask writing system software to control the direction, energy, and timing of an electron beam or laser to create the desired shape, dimensions, and location.

Embodiments of context specific mask writing may be applied effectively to various mask writing systems, including those utilizing either raster-scan and vector-scan techniques. For example the mask writing system may include an electron beam or laser 206. The beam or laser may use beam-scanning technologies such as raster-scan or vector-scan techniques, both of which may incorporate beam-shaping properties where the beam cross-section and shape may be controlled. Thus, system 206 has the ability to apply the beam 208 in both pinpoint and variable-shaped beam cross-sections.

For example, a raster-scanning technique may be used such that an electron beam 208 is scanned across a constantly moving glass photomask 212. In such a system, the beam 208 is then turned on and off to create polygonal shapes 210 on a pixel-by-pixel basis. Vector-scan techniques may use a more varied track of the beam 208 across a mask 212 to draw shapes. In either of the two approaches, the electron beam or laser-beam grayscale level may be changed on a pixel-by-pixel or vector basis, respectively, to account for localized mask making requirements such as electron or laser proximity effects.

In an embodiment of context specific mask writing, contextual information for individual mask elements, such as relative importance and function, may be provided to the writing system to allow more efficient control of the writing beam 208. The writing system may then optimize the impact of the writing beam on the resulting IC by altering the beam's energy, space, and/or time, based on the contextual information, such as individual circuit element functionality and criticality for example. Both raster-scan and vector-scan based systems can use the contextual information to provide more rapid mask writing by allowing individual mask elements to be written with varying precision and energy depending on their relative importance and function.

According to an embodiment, design feed forward, or "Design-Enabled Manufacturing," is provided by context specific mask writing. Design feed forward involves using or passing design intent information, such as device and net-to-physical-geometry relationships, directly or indirectly through priority or criticality data tags, to the mask writing tool. The shapes may then be written, spatially and temporally, in the proper context of the eventual circuit performance. One benefit of passing this contextual information is that the physical purpose of each circuit shape to be written may be prioritized in relation to its importance, criticality, domain, sensitivity of physical interaction, and overall manufacturing goals. With this information, significant efficiencies may be attained when vector-scan or raster-scan variable shaped-beam mask writers are used, because the electron-beam or laser-beam spot size can be varied from a fine pen nib to a broad brush. The same would apply when contextual information is used in a direct-write or maskless writing application or system.

In an embodiment applied to multipass writing, substantial improvements in write time may be achieved by focusing the writing system's resolution and time on features which can benefit from such attention, and by avoiding undue attention to those features which receive little or no such benefit. This may be done by focusing the number of multipasses to those features that have contextual information indicating such benefit. Thus, with context specific mask writing, multipass writing may achieve finer resolution than the write grid typically allows by stepping the interstices of the grid.

In one embodiment, a mask writer with IC design feed forward capabilities has contextual data describing hierarchies of criticality, and is therefore able to rank a feature list and adjust the beam size of the shaped beam mask writer accordingly. Data ordering within the mask design database based on a write queuing order is also possible, and may provide significant efficiencies over unordered mask databases, such as current MEBES files. This ordering can allow writing of the critical transistors and nets of an IC design, consistent with each feature's impact on the eventual product. A critical transistor or net might be written with the 'fine nib' at a time, order, and rate which allows a well-controlled photoresist thermal-and-photo-chemical equilibrium state to be achieved. This approach would prevent a relatively unimportant geometry, such as an area fill cell, from being written with the same precision as that of the critical transistors and interconnect nets of the IC.

An embodiment of the system may also prevent a logo command from being considered as the most critical cell of what may be a company's most important IC product. A hierarchy of feature importance and criticality may be ascertained on the basis of eventual circuit performance and manufacturing goals, thereby allowing a performance-yield writing strategy to be implemented. Additionally, estimates of process effects and circuit impact may be made based upon feature criticality, so that the beam order, shape, scan, and/or timing could be adjusted accordingly.

FIG. 3 illustrates a mask writing process according to an embodiment of context-specific mask writing. At block 302, an integrated circuit design process, or IC design flow, may include circuit design and analysis, layout synthesis and routing, and verification and tapeout. This produces an IC database or data file in a manner which includes polygonal and location information, and also circuit and manufacturing contextual information.

At block 304, IC design information and contextual information may be provided to a mask design process. The contextual information of an IC design, including layout geometry data as well as circuit functionality and criticality information, may be captured in a mask design database. For example, the design and contextual information, stored in an OpenAccess format and maintained on a computer readable media, such as a hard disk or other various storage media, may be transmitted via file transfer protocol (ftp) or other internet protocol.

At block 306, a context and priority analysis may be applied. For example, individual mask elements and their design data may be examined in relation to the operative physics of the mask and wafer lithography processes in which they may be used and in the context of the integrated circuit elements they are intended to produce on a chip wafer. Such parameters as the function of a resulting circuit element, the criticality of that function to the operation of the circuit, and the priority or importance of the mask feature relative to other features on the mask, among other varied parameters, may be included in such a contextual examination of individual mask elements. Criticality may include such information as the impact of a predicted or potential defect on or near a mask element, while priority may include an indication that a mask element should be written in a certain order or at the same time as another element, such as in the case of matched transistor elements.

In an embodiment, mask manufacturing priority information may be determined for the mask elements, 306, either manually (via user interface, for example) or via automated or computer-aided method. For example, this may be done through a combination of automated, computer-aided, and manual tools. These tools may include critical net timing analysis. Critical nets are those wires and transistors which are the most likely to limit the overall circuit performance.

Determining priority 306 may also include determining the ensemble of critical nets which, across a process window, will impact the overall IC product's yield at the specified performance target. In an embodiment, this information, as well as other a-priori design knowledge, is passed to the manufacturing process. For example, the mask writing, mask and IC inspection, mask repair, and mask and silicon metrology processes may obtain the context and priority information. Various other semi-automated or manual tools drawn from a toolkit of simulation, analysis, and database access and mining tools may be used which allow regions, cells, blocks or other specific geometric elements to be tagged on the basis of manufacturing needs, historical manufacturing learning, device physics requirements, and system uncertainties, among others. These tags may travel down stream in the mask flow and remain available throughout to give context to more efficient and intelligent processes, such as mask writing, mask inspection, and metrology processes, for example.

An embodiment of either a manual or automated prioritization analysis 306 may include a set of criteria, or thresholds, by which mask elements may be categorized or prioritized based on features such as their context, function, or criticality, for example. Such criteria or thresholds may include or be based on: critical timing nets; critical regions, blocks, or cells; less critical regions, blocks or cells, such as a logo or area fill cells; associations, such as matched transistor pairs; and location criticality, such as crossing of raster stripes.

Additionally, the mask design may account for the contexts of both the mask writing equipment and process, as well as the operative physics of the functioning circuit element and its relative importance and impact on the final product. For example, an area fill cell's purpose may be to help planarize the IC surface. The operative physics may be on the order of the magnitude of microns. The impact on the circuit may be low, except perhaps for third-order effects of capacitive parasitic coupling, where the area fill cell is within a certain distance of critical interconnects, hi mask design, and writing. An a-priori decision can be made automatically to set data tags associated with the figures describing these contexts and criticalities in the mask database, thereby allowing the writing or inspection strategy to adjust system resolution and processing accordingly.

At block 308, a process for appending, or re-ordering, mask design data may be performed, in addition to mask data preparation and job deck creation. For example, data may be added to or configured in a mask design database to reflect the context and priority of individual mask elements. Mask design data may be configured to emphasize the context and priority of individual mask elements in the mask design, or in a manufacturing plan for the mask. For example, such enhanced data may include: a manufacturing priority and writing order for each element; information regarding elements that should be matched and manufactured in a temporally contiguous manner, such as matched transistors or sense amplifiers in DRAMs; a precision for each element; and indicators showing which features are circuit-functional and which are optical or topological enhancement features. Such additional mask design detail would add contextual information to the polygonal mask shape and layout information contained in conventional mask databases, such as MEBES.

In an embodiment, a mask may be designed in blocks 304 through 308 based on a desired integrated circuit, knowledge of the optical and physical effects of a lithography process imaging the mask to the wafer surface, and knowledge of device and interconnect physics. The mask design may produce a mask design database or data file which may include such information on each mask element as dimension, shape, location, priority and circuit function criticality, in contrast to conventional systems in which no such "mask design" process currently exists in which contextual information and design feed-forward is applied.

Thus, rather than a loss of the such contextual information during tapeout, a database with layout and contextual information would be available for a mask design process to reorder the database in light of that contextual information, prior to mask data preparation, job deck creation, and fracturing of the data for use by the writing tool. Additionally, such contextual data would be maintained in a data file for use throughout and further down the mask flow, including inspection and beyond.

At block 310, mask design features may be written to the mask substrate. For example, as shown in FIG. 2, mask design information in a database or set of data files 202 may be passed through a network connection, 204, to a mask writing system 206 that controls a writing beam. Such mask design databases or files may be in various formats, including Open-Access, for example. An expanded and enhanced mask design database may be provided to a mask writing process 310 for use in applying a writing beam more efficiently in the manufacturing and functional context of an individual element being written. The mask writing block 310 may include using an enhanced mask design database to direct a writing beam so as to minimize the time and energy of the beam on each mask element in a prioritized order in accordance with the context and priority of that element.

An alternative embodiment may include further analysis and methods for applying mask design contextual information to the determination of which mask elements should receive various manufacturing, resolution or mask enhancements, such as Optical Proximity Correction (OPC), Phase Shift Masks (PSM), area fill cells, or laser proximity correction. Such a process for adding manufacturing enhancement features to mask elements may be applied to the mask design.

The following is an illustrative example of an embodiment including such a manufacturing enhancement analysis, which may include manual or automated prioritization of individual mask elements to determine which require such manufacturing enhancements. An automated version of the process may include, for example, a computer system and software program applying predetermined criteria to individual mask elements, as well as simulations of enhancements and IC effects.

Such determination may be based on such factors as: critical timing nets; critical circuit functioning of individual regions, blocks, or cells; less critical regions, blocks or cells, such as a logo or area fill cells; associations, such as matched transistor pairs; and location criticality, for example crossing of raster stripes. These factors may be pre-determined, or determined by an analysis of the internal parameters of the mask design. For various reasons, many mask elements may not require such enhancements. As one example of such an element often not requiring RET is an area fill cell, because its purpose is to fill space and its fidelity rarely impacts that purpose.

As a further example, many mask elements have dimensions on the order of or smaller than the wavelength of light used in photolithography systems. This may result in distortions of light transmitted through that mask due to such optical phenomena as diffraction and other nonlinear optical effects. Additionally, there may be distortions caused by chemical or thermal reactions in the circuit photo-resist or photo-emulsion.

Various techniques may be used to mitigate these distortions. Such mitigation techniques include Resolution Enhancement Technology (RET), Optical Proximity Correction (OPC) and Phase Shift Mask (PSM) technology. These techniques enable patterning circuit features smaller than one half the wavelength of the projection illumination through the use of non-circuit-functional mask features added to the design layout for purposes of resolution enhancement and process window improvement. Such techniques may limit the optical or chemical distortion effects at the circuit surface by adding corrective or enhancing features to original polygonal mask shapes.

Additionally, the increasingly fine tolerances of integrated circuits often require a highly planarized topology and a homogeneous chemical composition across a broad area of the circuit layer. This may be addressed by such added features as area fill cells, which are not electrically functioning parts of the circuit. Rather, such structures may serve to planarize the circuit topography in a vertical plane or the chemical vapor or plasma uniformity across the wafer during processes such as chemical vapor deposition, plasma etching or chemical-mechanical polishing.

Decisions on the application of these various techniques may also be informed by and benefit from the contextual design information made available according to an embodiment of the context specific manufacturing system. Such design feed forward may allow engineers closer to the manufacturing process to use the context data to more efficiently apply manufacturing or RET enhancements, for example.

An embodiment of the context specific mask writing system may also have application to various other processes and technologies, including writing and inspection system shaped-beam control, multipass writing techniques, integrated optical circuits (IOC), micro-electro-mechanical systems (MEMS), micro-electro-optic-mechanical systems (MEOMS), further Resolution Enhancement Technologies (RET), electron beam system enhancements such as sub-resolution assist features (SRAF), and maskless electron beam lithography systems.

Maskless electron beam or optical lithography may include using electron beam or laser-based systems to write a circuit pattern directly to a wafer without using a photomask and traditional projection photolithography. In such a system, an embodiment of the context specific mask writing method may include applying enhanced contextual and priority information in computer readable media via software or hardware system directly to such an electron beam system to more efficiently direct the electron beam to a circuit wafer. Further, embodiments of the context specific mask writing may apply to various materials and technologies beyond silicon IC, such as silicon-on-insulator, silicon-on-sapphire, silicon-germanium and gallium-arsenide, among others.

Figure 4:
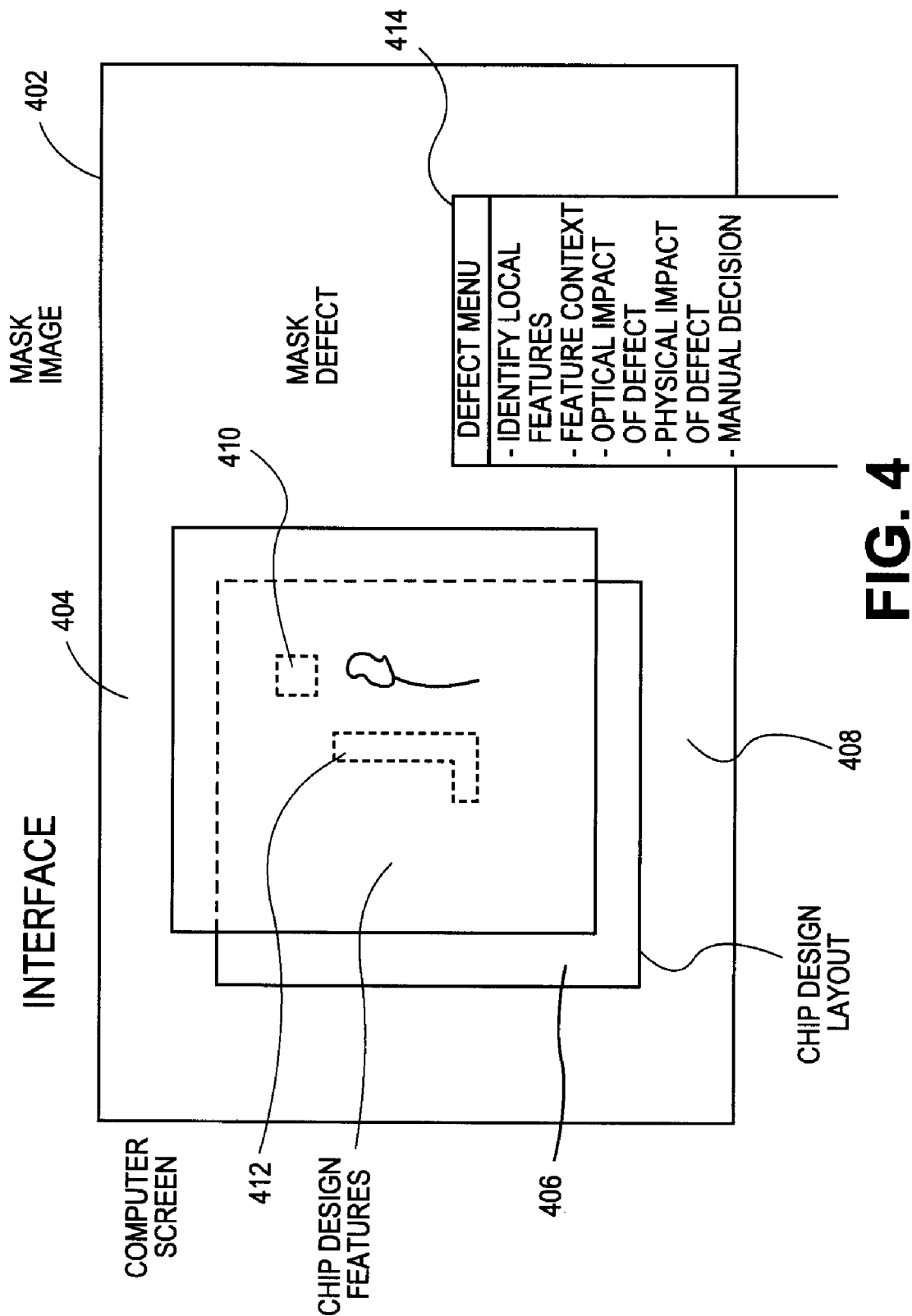
FIG. 4 illustrates an example of a user interface screen in an embodiment of context-specific mask writing.

FIG. 4 illustrates an example of an embodiment of a user interface to be used in an embodiment of the context specific mask writing system. An embodiment of such an interface may include simulations of the mask to be written, with overlaid circuit layer images of predicted circuit elements resulting from use of that mask in the photolithography process. In an embodiment, a projected defect may placed in simulation on the mask and matched to the expected distortions caused thereby in the circuit layer relative to any nearby circuit elements.

An embodiment of this interface may include a menu to be used manually with each mask element to offer a system user various options in examining potential mask defects and their effects on the resulting circuit, such as: identifying adjacent circuit features; obtaining context and priority data for adjacent circuit features from the mask design or IC design databases; evaluating likely optical distortions caused by the defect; evaluating the physical impact of the defect on the topology of the resultant circuit level; or other actions to be done manually in examining and addressing the defect.

This may allow further evaluation of circuit and mask tolerances, likely defect scenarios, and the application of RET and other manufacturing enhancement technologies according to the context of the various mask elements. Such an interface would offer a mask designer or mask writing system operator the ability to efficiently evaluate the mask design and its projected resultant circuit within the full context of the associated circuit and mask design databases. This may avoid expensive mask writing and correction.

Illustrative Example

Figure 5:
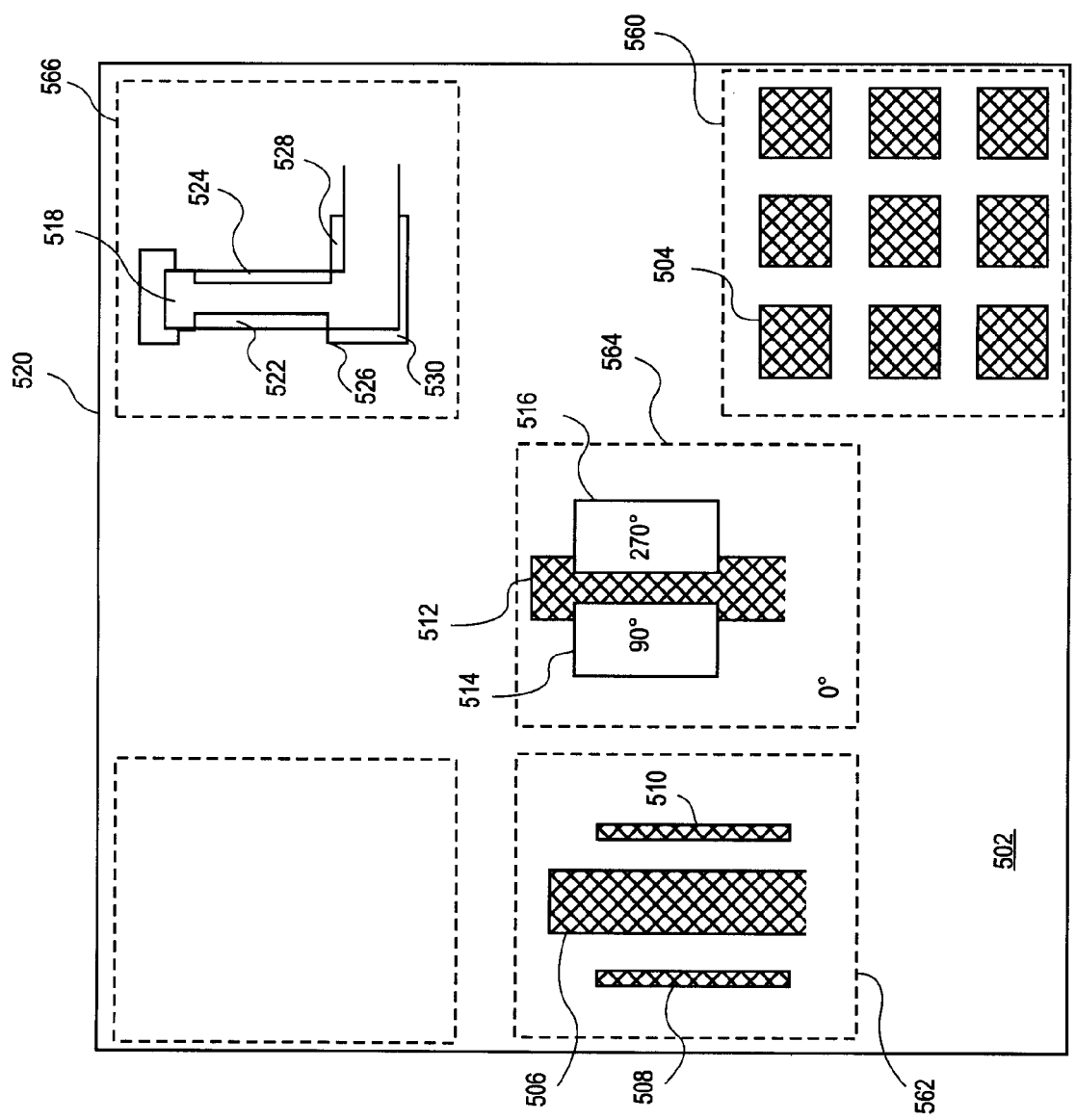
FIG. 5 is a top view of a mask with example mask elements thereon.

FIG. 5 is offered as an illustrative example of an embodiment of the context specific mask writing. Example design data and system processes are provided to help illustrate how such an embodiment may operate. FIG. 5 presents an example of a mask comprised of a glass substrate 502 with various portions (shown by boxed areas 560, 562, 564 and 566) offered as examples of mask elements and manufacturing enhancement features.

Box 560 shows an example of a set of area fill cells. For this example, assume that the field of 560 is a clear field and the photoresist process is positive tone allowing square patterns to be printed on the silicon. The purpose of these area fill patterns (also called dummy fill or waffle patterns) in this instance may be to enable planarization through a standard chemical-mechanical polishing process (CMP). The operative physics domain is one in which the effect of the fill patterns is based upon fluid flow equations, distributed force of the CMP pad, and other long-range order physics, on the order of a very large number of critical feature dimensions.

These features for the most part are decoupled from the circuit, however, parasitic coupling of interconnect wires to fill cells can make a significant difference. Their limiting circuit-wise physics is parasitic capacitive coupling. Small lithographic variations in size, on the order of fractions of a critical dimension, will have no impact on the circuit performance, reliability, or yield. Therefore the area fill cells might be assigned a relatively low overall circuit significance figure of merit, relatively low severity, and relatively low sensitivity to mask errors. For shaped-beam mask writers the shape of the beam may be broadened significantly, and multipass writing may not be required. Therefore, higher speed writing may occur.

Box 562 shows an example of a element 506 with scattering bars 508 and 510 intended to improve line width control and depth of focus. They may also provide a degree of optical resolution enhancement as well. For purposes of this illustrative example, element 506 is associated with a MOSFET gate which is important to the performance of the circuit, and thus has a higher priority element with stringent specifications on its shape, edge definition and fidelity. The scattering bars are also of higher priority because they are placed at an exact and uniform distance parallel to element 506. For this example, assume that the field of 562 is a clear-field chrome-on-glass mask and that the photoresist process is positive tone. Alternatively, if considered a dark-field mask, the dark field could be the partial absorber of an attenuated PSM mask.

Box 564 shows an example with a 90-degree phase shift region 514 and a 270-degree phase shift region 516 adjacent to a chrome line 512 on a clear field 0-degree phase background. The phase shifting areas 514 and 516 are intended to counteract optical distortions that may negatively impact 512. The element 512 may be associated with a medium critical MOSFET transistor. The operative physical effects which are considered in the classification and prioritization of these features are primarily lithographic imaging effects, unique requirements and effects of a single exposure altPSM and short channel MOSFET device physics. Mask patterning error effects in the resulting circuit may be compounded due to the highly non-linear nature of deep sub wavelength lithographic printing combined with the non-linear channel-length-to-voltage threshold relationship, for example. Phase shifter size as well as etch depth and undercut may also be critical. For purposes of this illustrative example, element 512 is a high priority element, located in a non-critical mask area, with strict dimension and location specifications. Elements 514 and 516 have lower priority and relatively loose location and dimension requirements.

Box 566 shows an example of a MOSFET gate element 518 with Optical Proximity Correction (OPC) elements 520, 522, 524, 526, 528 and 530 intended to compensate for Optical Proximity Effect (OPE) distortion around 518. For purposes of this illustrative example, element 518 is a critical mask element associated with a critical circuit function. It is located in a critical circuit area, and has strict dimension and location requirements. OPC elements 520, 522, 524, 526, 528 and 530 have no circuit function and low priority, but are located and shaped within narrow specifications.

By way of one example of an embodiment, boxed area 560 of FIG. 5 demonstrates a plurality of area fill cell shapes, one of which is 504, on a mask substrate 502. Consider if the example fill cell 504 were placed in a non-critical area of a circuit solely to fill space. Consider further element 504 to have various associated contextual parameters for intelligent mask writing, including: very low priority; non-critical dimensions and location; and high tolerance to mask write defects. Fill cells such as 504 may be added to a mask to produce a set of structures on a chip that are not part of the electrical operation of the circuit, but rather to improve the topographical planarization and spatial homogeneity of that circuit layer.

With these example contextual parameters in mind, and referring to FIGS. 3 and 5, an embodiment applied to this example may employ the following methods and systems to improve the mask writing process. Mask element 504 and the other fill cells in boxed area 560 may be designed in either an IC design process 302, or later in a mask design process 306 and 308. Focusing on element 504, its polygonal shape, location, orientation and context information, such as its resulting circuit element's function and criticality, may be described by a plurality of data elements in data file 304. The data file 304 may be maintained in a database stored on computer readable media such as a hard disk and passed via software or hardware, or over an internet connection in ftp format for example, to a mask design process 306 and 308.

Mask element 504 and its contextual information may then pass to an analysis block 306, wherein its context may be evaluated and its mask writing priority determined manually or by a computer-aided automated process. In such an analysis block 306, as a very low-level priority element in a non-critical mask area, standard writing system parameters and tolerances may be applied with little further analysis. Further, shaped-beam parameters of the writing tool may be adjusted accordingly for low resolution and high speed. Alternatively, criteria for priority, criticality, dimensions, location, and sensitivity to defects, among others, may be applied to data for 504 manually or via automated process of comparison to determine its manufacturing context and priority relative to the rest of the mask elements. In other words, analysis block 306 will determine in what order 504 will be written and with what precision.

Context and priority analysis 306 data may then be appended to or configured in block 308 to the initial design data 302 for mask element 504. In this example, this would mean that mask element 504 would have polygonal, location and context information identified together. Specifically, based on the example context information for 504 above, data may be appended to or configured in the design data to reflect the context and priority of element 504 in the manufacturing plan to write the mask.

As an example, the design file may contain various fields and identifiers, such as:

Circuit function=None (where the potential values or identifiers may include, for example: None, MOSFET, Critical Signal Interconnect, Power, or Logo);

Circuit Function Priority=Low (where the potential values or identifiers may include, for example: Low, Medium or High);

Circuit Criticality=none (where the potential values or identifiers may include, for example: None, low, medium or critical);

Relative Mask Priority=none (where the potential values or identifiers may include, for example: none, low, medium or high);

Process Purpose=CMP fill mask (where the potential values or identifiers may include, for example: CMP fill mask, Critical feature mask, OPC feature, PSM feature, assist feature, or none);

Critical Processes (inferred Physics): CMP (where the potential values or identifiers may include, for example: CMP, Lithography, or mask);

Manufacturing Enhancements associated with this element?=No (where the potential values or identifiers may include, for example: yes or no);

Enhancement Priority=None (where the potential values or identifiers may include, for example: none, low, medium or high);

Dimension and Shape Fidelity=Low (where the potential values or identifiers may include, for example: low, medium or high);

Relative Location Importance=Low (where the potential values or identifiers may include, for example: low, medium or high);

Circuit Value=Low (where the potential values or identifiers may include, for example: low, medium or high);

Manufacturing Tips?=No (where the potential values or identifiers may include, for example: yes or no, with notes if necessary).

No specific format or terminology is required. For example, a different scale or other quantitative or qualitative values may be used. Additionally, the database may be re-ordered to place data for area 560 in an area or order within the mask database wherein it may be most efficiently and effectively retrieved.

This enhanced mask design data may be used by a mask writing system 310 to more efficiently apply a writing beam to a mask substrate in accordance with said context, priority, enhancement features and beam shape. For example, the mask writing system 310, may be directed to apply as little time, energy and precision to area fill cell 504 as possible, and to write such elements after the other elements have been completed. Element 504 would be written for example after high priority elements (such as those in boxed areas 564 and 566) have been written with great precision and carefully chosen energy distribution.

In an embodiment utilizing a shaped-beam mask writing system, such system may be controlled by the enhanced mask design data such that a broad beam cross-section is applied to create such low-priority fill cells 504 as quickly and efficiently as possible. Additionally, due to its low priority, element 504 may be written with standard writing system parameters and tolerances, and not any tailored writing requirements as shown in the following examples.

By way of further example, boxed area 562 of FIG. 5 shows a MOSFET gate 506 with nearby scattering bars 508 and 510. Consider if the mask element 506 were an important, but not critical, connector element for the operation of the resulting circuit. Consider element 506 to have various associated contextual parameters for intelligent mask writing, including: medium-level priority; a relatively simple shape; location in a non-critical area of the circuit; specific requirements for definiteness, straightness and uniformity; and low tolerance for mask write defects.

Elements 508 and 510 are set at a distance calculated to produce optical effects around the mask element improving the line width control and depth of focus of the photolithography system at the wafer surface. Scattering bars 508 and 510 may be given high priority, because their misplacement or defects in their shape may have a significant negative impact on the functional mask element 506 or other elements of the circuit. Consider elements 508 and 510 to have various associated contextual parameters, including: high priority and strict dimension, location and relative orientation requirements, but with no circuit function.

With these example contextual parameters in mind, and referring to FIGS. 3 and 5, an embodiment applied to this example may employ the following methods and systems to improve the mask writing process. Mask element 506 and scattering bars 508 and 510 may be designed in an IC design process 302, or scattering bars 508 and 510 may also be designed and added later as RET in a mask design process 306 and 308.

Focusing on element 506, its polygonal shape, location, orientation and context information, such as its resulting circuit element's function and criticality, may be described by a plurality of data elements in a data file 304 maintained in a database on computer readable media, such as a hard disk, and passed via software or hardware, or often over an internet connection in, for example, ftp format to a mask design process 306 and 308. Specifically, mask element 506 and its contextual information may then pass to an analysis block 306, wherein its context may be evaluated and its mask writing priority determined manually or by a computer-aided automated process.

RET and other enhancements may also be added, either manually or by computer-aided process, based on element context and priority. In such an analysis block 306, as a medium-level priority element, standard writing system parameters and tolerances may be applied. Further, shaped-beam parameters of the writing tool may be adjusted accordingly for medium resolution and speed, for example. Alternatively, criteria for priority, criticality, dimensions, location, and sensitivity to defects, among others, may be applied to 506 manually or via automated process of comparison to determine its manufacturing context and priority relative to the rest of the mask elements. In other words, analysis block 306 will determine in what order 506 will be written and with what precision.

Context and priority analysis 306 data is then appended to or configured in block 308 to the initial design data 302 for mask element 506. In this example, this would mean that mask element 506 would be identified with its dimension, location, context and priority data, such that said mask element 506 is distinguished from such other elements as scattering bars 508 and 510. Specifically, based on the example context information above, data may be appended to or configured in the design data to reflect the context and priority of element 506 in the manufacturing plan to write the mask.

As an example, the design file may contain various fields and identifiers for 506, such as:
Circuit function=MOSFET;
Circuit Function Priority=Medium; Circuit Criticality=Medium;
Relative Mask Priority=Medium;
Process Purpose=functional mask feature;
Critical Processes (inferred Physics): lithography;
Manufacturing Enhancements associated with this element?=Yes, 508 and 510;
Enhancement Priority=High;
Dimension and Shape Fidelity=High;
Relative Location Importance=Medium;
Circuit Value=Medium;
Manufacturing Tips?=Yes, write 508 and 510 contemporaneously as they are matched.

See text accompanying area 560 above for further example field values for the various example identifier categories above.

Additionally, scattering bars 508 and 510 may also have their own individual data with similar data fields and values reflecting their function, criticality and other associated contextual data, such as, for example:
Relative Mask Priority=High;
Circuit function=None;
Process Purpose=OPC;
Dimension and Shaped Fidelity=High; and
Relative Location Importance=High.

No specific format or terminology is required. For example, a different scale or other quantitative or qualitative values may be used. Additionally, the database may be re-ordered to place data for area 562 in an area or order within the mask database wherein it may be most efficiently and effectively retrieved.

This enhanced mask design or manufacturing plan data may be used by a mask writing system 310 to more efficiently apply a writing beam to a mask substrate in accordance with said context, priority, enhancement features and beam shape of elements 506, 508 and 510. For example, the mask writing system 310, may be directed to apply as much or more time, energy and precision to scattering bars 508 and 510 as to the functional element 506, because of the high priority they are given.

Per the manufacturing tip, elements 508 and 510 may be written together, with element 506 written before or after to allow for dissipation of any built up heat caused by the writing beam in creating 508 and 510. Additionally, element 506 may be written after other higher priority elements, such as those in boxed areas 564 or 566, as 506 is important, but not critical, and of medium mask priority. Element 506 may also be written more quickly or with less energy than higher priority elements.

By way of another example of an embodiment, boxed area 564 of FIG. 5 shows a mask element 512 intended to produce on a circuit wafer a functional transistor element, such as a MOSFET transistor, that is important, and of medium criticality, to the functioning of the circuit. Consider if element 512 were to have various associated contextual design parameters for intelligent mask writing, including: high priority; fine dimension specifications; a location in a non-critical area of the circuit; medium fidelity tolerances; and mid-range sensitivity to mask writing defects. Elements 514 and 516 are Phase Shifting Mask (PSM) features for element 512-514 and 516 having 90-degree and 270-degree phase shifting properties, respectively. Such PSM features may be added to alter the phase of the light passing on at least one side of a mask feature in order to control optical interference phenomena such that the resolution and depth of focus of the resultant image is improved at the wafer surface. Consider these PSM elements to have their own various associated contextual design parameters, such as: low priority; low fidelity requirements; low sensitivity to mask writing defects, and no circuit function.

With the above example contextual parameters in mind, and referring to FIGS. 3 and 5, an embodiment applied to this example may employ the following methods and systems to improve a mask writing process. Mask element 512 and the PSM features 514 and 516 may be designed in an IC design process 302, or, alternatively, PSM features 514 and 516 may be designed and added later as RET in the mask design process 306 and 308. The polygonal shape data for 512, along with location, orientation and other context information, such as the circuit element's function and criticality, may be described by a plurality of data elements in data file 304 maintained in computer readable media, such as a hard disk, and passed via software or hardware, or over the internet via ftp protocol, for example, to a mask design process 306 and 308.

Specifically, mask element 512 and its contextual information may be passed to an analysis block 306, wherein its context may be evaluated and its priority determined manually or by a computer-aided automated process. In this analysis block 306, as a high priority element, criteria for priority, criticality, dimensions, location, and sensitivity to defects, among others, may be applied to 512 manually or via automated process of comparison to determine that element's mask writing context and priority relative to other mask elements.

In other words, block 306 may determine in what order and with what precision element 512 will be written. RET and other enhancements may also be added, such as PSM features 514 and 516, if not already included, either manually or by computer-aided process, based on element 512 context and priority. Further, shaped-beam parameters of the writing tool may be adjusted accordingly for medium or high resolution and medium speed.

Context and priority analysis 306 data may be appended to or configured in block 308 to the initial design data 302 for said mask element 512. In this example, this would mean that mask element 512 would be identified with its polygonal, location, context and priority data, such that said mask element 512 is distinguished from and prioritized more highly than its adjacent PSM elements 514 and 516.

Specifically, based on the example context information for 512 above, data may be appended to or configured in the mask design data to reflect the context and priority of element 512 and to operate as a contextual manufacturing plan for writing the mask. As an example, the design file may contain various data fields and identifiers for 512, such as:

Circuit function=MOSFET;
Circuit Function Priority=High;
Circuit Criticality=Medium;
Relative Mask Priority=Medium;
Process Purpose=functional mask feature;
Critical Processes (inferred Physics): lithography;
Manufacturing Enhancements for this element?=Yes, 514 and 516;
Enhancement Priority=low;
Dimension and Shape Fidelity=High;
Relative Location Importance=Medium;
Circuit Value=Medium;
Manufacturing Tips?=No.

See text accompanying area 560 above for further example field values for the various example identifier categories above.

Additionally, PSM features 514 and 516 may have their own individual data above with similar data fields and values reflecting their function, criticality and other associated contextual data, such as, for example:

Circuit function=None;
Circuit Function Priority=Low;
Circuit Criticality=None;
Process Purpose=PSM feature;
Critical Processes (inferred Physics): lithography.

No specific format or terminology is required. For example, a different scale or other quantitative or qualitative values may be used. Additionally, the database may be re-ordered to place data for area 564 in an area or order within the mask database wherein it may be most efficiently and effectively retrieved.

The enhanced mask design data may be used by a mask writing system 310 to more efficiently apply a writing beam to a mask substrate in accordance with said context, priority, enhancement features and beam shape. For example, element 512 may be written after other higher priority elements, such as those in boxed area 566, as 512 is of medium priority and is important, but less critical than 566. Element 512 may also be written more quickly or with less energy than higher priority elements. Furthermore, based on the distinction between a functional mask element 512 and lower priority elements, such as PSM features 514 and 516, the mask writing system 310 would be directed to apply more time and energy to element 512. In the context of mask element 512 and the desired circuit, those PSM features serve only to improve the depth of focus of the lithography system for functional element 512, and their value follows from their impact on that element 512. PSM elements 514 and 516 may then be written with less energy or precision. Additionally, elements 514 and 516 may be written at a different time than 512, as no manufacturing tips or design indicators require otherwise.

By way of a final example of an embodiment context specific mask writing, the boxed area at 566 in FIG. 5 shows a mask element 518 intended to produce on a circuit wafer a functional transistor element (for example, a MOSFET gate) that is critical to the ultimate functioning of the circuit. Consider if element 518 were to have various associated contextual parameters for intelligent mask writing, including: high priority; fine dimensions; location in a critical area of the circuit; high fidelity specifications; and high sensitivity to mask writing defects. Elements 520, 522, 524, 526, 528 and 530 are Optical Proximity Correction (OPC) features for element 518 on a mask substrate 502. Such additional features may be used to pre-distort a mask element such that the transmission of light around the element produces an improved image of the intended circuit element at the wafer surface. Consider these OPC elements to have various associated contextual parameters, including: medium priority and strict dimension and location specifications, but no circuit function.

With the above example contextual parameters in mind, and referring to FIGS. 3 and 5, an embodiment applied to this example may employ the following methods and systems to improve the mask writing process. Mask element 518 and its OPC features (520-530) may be designed in an IC design process 302, or OPC features 520-530 may alternatively be designed and added later as RET in the mask design process 306 and 308. Focusing on element 518, its polygonal shape, location, orientation and other context information, for example, the circuit element's function, criticality and priority, may be described by a plurality of data elements in data file 304 maintained in computer readable media, such as a hard disk, and passed via software or hardware, or often over the internet via ftp protocol, for example, to a mask design process 306 and 308.

The mask element 518 and its contextual information may then pass to an analysis block 306, wherein its context may be evaluated and its mask writing priority determined manually or by a computer-aided automated process. In such an analysis block 306, as a high priority element, criteria for priority, criticality, dimensions, location, and sensitivity to defects, among others, may be applied to 518 manually or via automated process of comparison to determine its mask writing context and priority relative to the other mask elements. In other words, block 306 may determine in what order and with what precision 518 will be written. RET and other enhancements may also be added, such as OPC features 520, 522, 524, 526, 528 and 530, if not already included, either manually or by computer-aided process, based on element context and priority. Further, shaped-beam parameters of the writing tool may be adjusted accordingly for high resolution.

Context and priority analysis 306 data may be appended to or configured in 308 to the initial design data 302 for said mask element 518. In this example, this would mean that mask element 518 would be identified together with its dimension, location, context and priority data, such that said mask element 518 is distinguished from such other mask features as the OPC elements 520, 522, 524, 526, 528, 530. Specifically, based on the example context information above, data may be appended to or configured in the design data to reflect the context and priority of element 518 in the manufacturing plan to write the mask.

As an example, the design file may contain various data fields and identifiers for 518, such as:
  Circuit function=MOSFET;
  Circuit Function Priority=High;
  Circuit Criticality=High;
  Relative Mask Priority=High;
  Process Purpose=functional mask feature;
  Critical Processes (inferred Physics): lithography;
  Manufacturing Enhancements for this element?=Yes, 520-530;
  Enhancement Priority=low;
  Dimension and Shape Fidelity=High;
  Relative Location Importance=High;
  Circuit Value=High;
  Manufacturing Tips?=Yes, write contemporaneously with OPC 520-530.

See text accompanying area 560 above for further example field values. Additionally, OPC features 520-530 may have their own individual data above with similar data fields and values reflecting their function, criticality and other associated contextual data, such as, for example:
  Circuit function=None;
  Circuit Function Priority=Low;
  Circuit Criticality=None;
  Process Purpose=OPC feature;
  Critical Processes (inferred Physics): lithography.

No specific format or terminology is required. For example, a different scale or other quantitative or qualitative values may be used. Additionally, the database may be re-ordered to place data for area 566 in an area or order within the mask database wherein it may be most efficiently and effectively retrieved.

This enhanced mask design data may be used by a mask writing system 310 to more efficiently apply a writing beam to a mask substrate in accordance with said context, priority, enhancement features and beam shape. For example, element 518 may be written first, with a carefully chosen energy distribution, a pinpoint writing beam and a slow beam trajectory, because of it's critical circuit value and high priority relative to other mask elements.

Furthermore, distinguishing between the high priority of element 518 and the relatively lower or secondary priority of OPC features 520, 522, 524, 526, 528, 530, the mask writing system may be directed to focus more time and energy on the functional element 518 than on the OPC features. In the context of the mask element 518 and the desired circuit, those features serve only to improve the fidelity of the functional element 518, and their value follows from their impact on that element 518. Additionally, the enhancement elements may be written more quickly with a vector-beam, but contemporaneously with their identified mask element 522 per the manufacturing tip.

For this example overall, then, contextual and priority data for the various mask elements may be evaluated to produce a manufacturing plan for writing the mask in a more efficient manner. Specifically, the resultant mask design file and manufacturing plan would be configured to direct the writing beam accordingly. Using the maximum energy and resolution and a pinpoint focus for the writing beam, the following elements would be written in order: 518, 520-530, 508 and 510 matched, 512, and 506. Following those and at a lower resolution, a faster beam traverse rate and a wider beam shape, if available, the following elements would be written in order: 514, 516 and 504.

FIGS. 6A through 6G show examples of information provided by considering design features with respect to the context of the design. This context information, which may be used to identify critical features, is significantly more useful than labeling each design feature with a tag that provides no indication as to why or how the feature is critical. The element is a via, represented as a larger square on a first layer and a smaller square on a second layer. The context of the via can be used to identify which features of the via are critical. A fabrication rule may state that the via is completely enclosed by the first layer, even in the presence of process uncertainty. The smaller square on the second layer may be in different locations relative to the larger square on the first layer.

Figure 6A:
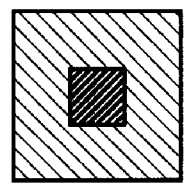
FIGS. 6A through 6G show examples of information provided by considering design features with respect to the context of the design.
Figure 6B:
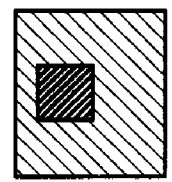
Figure 6C:
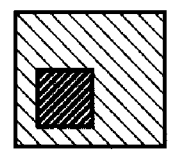
Figure 6D:
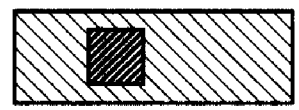
Figure 6E:
Figure 6F:
Figure 6G:
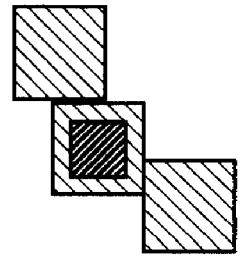

For the embodiment of FIG. 6A, the placements of the sides are not critical. As shown in FIG. 6B, one side is critical. In FIGS. 6C and 6D, two sides are critical. FIG. 6E shows an example having three sides that are critical. In FIG. 6F, placement of all four sides is critical. In FIG. 6G, portions of some edges are critical and others are not.

The vias themselves, and some of the constraints (such as minimum area for example), are identical in FIGS. 6A through 6F. However, whether the edge placement is critical (and hence worth the cost of providing increased accuracy during the mask writing, or is rejected as a defect during the mask inspection), may not be determined from the fact that the figure represents a via, or by marking the via as critical. Rather, the context information may be used to determine the critical and non-critical features of the via. In this case, the context information could be used to individually mark each edge as critical or non-critical.

The mask writing process may be used with a mask inspection process. For example, the inspection process disclosed in U.S. Pat. No. 7,231,628, and which is incorporated herein by reference in its entirety, may be used to inspect a mask written with a process as disclosed herein.

These and other embodiments of the present invention may be realized in accordance with the above teachings and it should be evident that various modifications and changes may be made to the above described embodiments without departing from the broader spirit and scope of the invention. The specification and drawings are, accordingly, to be regarded in an illustrative rather than restrictive sense and the invention measured only in terms of the claims.

The invention claimed is:

1. A computer implemented method for mask writing, comprising:
   using at least one computer system that is programmed for:
   designing an integrated circuit;
   passing the design data to a context and priority analysis action;
   performing the context and priority analysis action by at least analyzing at least the design data for a mask element in a mask for the integrated circuit to determine a circuit function, circuit criticality context, and priority of the mask element, wherein
     at least the priority of the mask element is used to allocate resources of a mask writing equipment in manufacturing the mask;
   including the circuit function, circuit criticality context, and priority data in a mask design data file; and
   using at least the mask design data file to determine an electron beam size, shape, and intensity of the mask writing equipment that is used to manufacture the mask.

2. The method of claim 1, wherein design data from the integrated circuit design comprises:
   circuit functionality and circuit criticality data for mask elements.

3. The method of claim 2, wherein analyzing further comprises:
   comparing design data for the mask elements to design data for other mask elements and to a predetermined set of mask criteria.

4. The method of claim 2 in which the data from the integrated circuit design comprises
   polygonal shape, location, layout geography, for the mask elements.

5. The method of claim 1, wherein the design data being analyzed are on one layer of the integrated circuit.

6. The method of claim 1, wherein the design data being analyzed are across multiple layers of the integrated circuit design.

7. The method of claim 1, wherein the act of analyzing the design data considers at least one or more of the following:
   interfeature process proximity effects;
   interfeature coupling across layers;
   interfeature electronic relationships; or
   wire interconnects longer than a given length.

8. A system for mask writing, comprising:
   a computer system that is configured for performing:
   designing an integrated circuit;
   passing the design data to a context and priority analysis action;
   performing the context and priority analysis action by at least analyzing at least the design data for a mask element in a mask for the integrated circuit to determine a circuit function, circuit criticality context, and priority of the mask element, wherein
     at least the priority of the mask element is used to allocate resources of a mask writing equipment in manufacturing the mask;
   including the circuit function, circuit criticality context, and priority data in a mask design data file; and
   using at least the mask design data file to determine an electron beam size, shape, and intensity of the mask writing equipment that is used to manufacture the mask.

9. The system of claim 8, wherein design data from the integrated circuit design comprises:
   circuit functionality and circuit criticality data for mask elements.

10. The system of claim 9, wherein the means for analyzing further comprises:
    means for comparing design data for the mask elements to design data for other mask elements and to a predetermined set of mask criteria.

11. The system of claim 9 in which the data from the integrated circuit design comprises
    polygonal shape, location, layout geography, for the mask elements.

12. The system of claim 8, wherein the design data being analyzed are on one layer of the integrated circuit.

13. The system of claim 8, wherein the design data being analyzed are across multiple layers of the integrated circuit design.

14. The system of claim 8, wherein the means for analyzing the design data considers at least one or more of the following:
    interfeature process proximity effects;
    interfeature coupling across layers;
    interfeature electronic relationships; or
    wire interconnects longer than a given length.

15. A computer program product comprising computer usable storage medium having executable code which, when executed by a computer system, causes the computer system to execute a process for mask writing, the process comprising:
    designing an integrated circuit;
    passing the design data to a context and priority analysis action;
    performing the context and priority analysis action by at least analyzing at least the design data for a mask element in a mask for the integrated circuit to determine a circuit function, circuit criticality context, and priority of the mask element, wherein
      at least the priority of the mask element is used to allocate resources of a mask writing equipment in manufacturing the mask;
    including the circuit function, circuit criticality context, and priority data in a mask design data file; and using at least the mask design data file to determine an electron beam size, shape, and intensity of the mask writing equipment that is used to manufacture the mask.

16. The computer program product of claim 15, wherein design data from the integrated circuit design comprises:
    circuit functionality and circuit criticality data for mask elements.

17. The computer program product of claim 16, wherein analyzing further comprises:
    comparing design data for the mask elements to design data for other mask elements and to a predetermined set of mask criteria.

18. The computer program product of claim 16 in which the data from the integrated circuit design comprises polygonal shape, location, layout geography, for the mask elements.

19. The computer program product of claim 15, wherein the design data being analyzed are on one layer of the integrated circuit.

20. The computer program product of claim 15, wherein the design data being analyzed are across multiple layers of the integrated circuit design.

21. The computer program product of claim 15, wherein the act of analyzing the design data considers at least one or more of the following:
    interfeature process proximity effects;
    interfeature coupling across layers;
    interfeature electronic relationships; or
    wire interconnects longer than a given length.

* * * * *